(12) United States Patent
Takaoka et al.

(10) Patent No.: US 8,017,225 B2
(45) Date of Patent: Sep. 13, 2011

(54) CUTTING TOOL MADE OF SURFACE-COATED CUBIC BORON NITRIDE-BASED ULTRAHIGH PRESSURE SINTERED MATERIAL

(75) Inventors: Hidemitsu Takaoka, Naka-gun (JP); Itsuro Tajima, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 1089 days.

(21) Appl. No.: 11/613,323

(22) Filed: Dec. 20, 2006

(65) Prior Publication Data
US 2007/0148496 A1  Jun. 28, 2007

(30) Foreign Application Priority Data

Dec. 22, 2005 (JP) ................................. 2005-370000
May 22, 2006 (JP) ................................. 2006-142108

(51) Int. Cl.
*B23B 27/14* (2006.01)
(52) U.S. Cl. ............ 428/216; 51/307; 51/309; 428/336; 428/697; 428/698; 428/699
(58) Field of Classification Search ............. 51/307, 51/309; 428/216, 336, 697, 698, 699, 701, 428/702, 704
See application file for complete search history.

(56) References Cited

U.S. PATENT DOCUMENTS

| | | | |
|---|---|---|---|
| 5,503,912 A * | 4/1996 | Setoyama et al. ............ 428/699 |
| 5,580,653 A | 12/1996 | Tanaka et al. | |
| 5,709,907 A | 1/1998 | Battaglia et al. | |
| 5,712,030 A | 1/1998 | Goto et al. | |
| 5,722,803 A | 3/1998 | Battaglia et al. | |
| 5,853,873 A | 12/1998 | Kukino et al. | |
| 5,882,777 A | 3/1999 | Kukino et al. | |
| 5,882,778 A | 3/1999 | Sugizaki et al. | |
| 6,077,596 A * | 6/2000 | Hashimoto et al. ........... 428/698 |

(Continued)

FOREIGN PATENT DOCUMENTS

DE 19546357 A1 6/1996

(Continued)

OTHER PUBLICATIONS

Anderson et al "Deposition, microstructure and mechanical and tribological properties of magnetron sputtered TiN/TiAlN multilayers" Surface and Coatings Technology 123 (2000) pp. 219-226.*

(Continued)

*Primary Examiner* — Archene Turner
(74) *Attorney, Agent, or Firm* — Leason Ellis LLP.

(57) ABSTRACT

A cutting tool made of surface-coated cubic boron nitride-based ultrahigh pressure sintered material, comprising a cutting insert main body formed by ultrahigh pressure sintering of compact composed of titanium nitride, aluminum and/or aluminum oxide, and boron nitride, and a hard coating layer vapor deposited on the main body. The main body has a texture containing cubic boron nitride, titanium nitride and reaction product. The hard coating layer has a lower layer of composite nitride having a composition of $[Ti_{1-X}Al_X]N$, where X is in a range from 0.40 to 0.60 in an atomic ratio, and the upper layer comprises a thin layer A having the composition of $[Ti_{1-X}Al_X]N$, where X is in a range from 0.40 to 0.60 in an atomic ratio, and a thin layer B consisting of a Ti nitride (TiN). The upper layer has a consisting of the thin layer A and a thin layer B layered alternately.

6 Claims, 2 Drawing Sheets

U.S. PATENT DOCUMENTS

| | | | |
|---|---|---|---|
| 6,103,357 A * | 8/2000 | Selinder et al. | 428/697 |
| 6,309,738 B1 * | 10/2001 | Sakurai | 428/216 |
| 6,395,379 B1 * | 5/2002 | Braendle | 428/216 |
| 6,599,062 B1 | 7/2003 | Oles et al. | |
| 6,623,850 B2 * | 9/2003 | Kukino et al. | 428/336 |
| 6,737,178 B2 | 5/2004 | Ota et al. | |
| 7,060,345 B2 * | 6/2006 | Fukui et al. | 428/216 |
| 7,094,479 B2 * | 8/2006 | Sato et al. | 428/698 |
| 7,258,912 B2 | 8/2007 | Yamamoto et al. | |
| 7,510,761 B2 | 3/2009 | Kondo et al. | |
| 2001/0003569 A1 | 6/2001 | Ota et al. | |
| 2003/0096142 A1 | 5/2003 | Whiteis | |
| 2005/0170162 A1 | 8/2005 | Yamamoto et al. | |
| 2007/0148496 A1 | 6/2007 | Takaoka et al. | |

FOREIGN PATENT DOCUMENTS

| | | |
|---|---|---|
| EP | 0695731 A1 | 2/1996 |
| EP | 0709353 | 5/1996 |
| EP | 1312593 | 5/2003 |
| EP | 1382709 | 1/2004 |
| EP | 1470879 | 10/2004 |
| EP | 1690959 A2 | 8/2006 |
| EP | 1801260 A1 | 6/2007 |
| JP | 59153851 A | 9/1984 |
| JP | 07-205362 A | 8/1995 |
| JP | 7-300649 A | 11/1995 |
| JP | 07-310174 A | 11/1995 |
| JP | 8-119774 A | 5/1996 |
| JP | 08-323506 | 12/1996 |
| JP | 2001-234328 | 8/2001 |
| JP | 2003-245806 | 9/2003 |
| JP | 2004345006 A | 12/2004 |

OTHER PUBLICATIONS

Hsieh et al "Deposition and characterization of TiAlN and multilayered TiN/TiAlN coatings using unbalanced magnetron sputtering". Surface and Coatings Technology 108-109 (1998) pp. 132-137.*

* cited by examiner

CUTTING TOOL MADE OF SURFACE-COATED CUBIC BORON NITRIDE-BASED ULTRAHIGH PRESSURE SINTERED MATERIAL

BACKGROUND OF THE INVENTION

1. Field of the Invention

The present invention relates to a cutting tool made of a surface-coated cubic boron nitride-based ultrahigh pressure sintered material (hereinafter referred to as a surface-coated cBN-based sintered tool) comprising a cutting tool body made of a cubic boron nitride-based sintered material and a hard coating layer provided on the surface of the cutting tool body, which comprises a hard coating layer having excellent high-temperature hardness, high-temperature strength, heat resistance and edge notching resistance, and also can exhibit excellent edge notching resistance and maintain excellent surface finish over an extended period of time even in a high speed cutting operation of a hardened steel, such as alloy steel or hardened bearing steel.

This application claims priority on Japanese Patent Application No. 2005-370000 filed on Dec. 22, 2005 and Japanese Patent Application No. 2006-142108 filed on May 22, 2006, the disclosure of which is incorporated by reference herein.

2. Background Art

A surface-coated cBN-based sintered tool in general includes insert that is removably attached at the tip of a cutting tool for turning of workpieces made of various steels or cast iron, an insert type end mill that is removably attached with the indexable insert and is used in planning, grooving and shouldering of workpieces in a manner similar to that of the solid end mill.

One known constitution of surface-coated cBN-based sintered tools comprise a tool body made of various cubic boron nitride-based ultrahigh pressure sintered materials (hereinafter referred to as a cBN-based sintered material) and a surface-coating layer such as a Ti nitride (TiN) layer or a titanium aluminum nitride ([Ti, Al]N) layer formed by vapor deposition on the surface of the tool bodies. It is also known that these surface-coated cBN-based sintered tools are used for cutting workpieces made of various steels or cast irons (Japanese Unexamined Patent Application, First Publication No. Hei 7-300649).

It is also known that the above-described surface-coated cBN-based sintered tool can be manufactured by coating the surface of the tool body S with a layer of desirable composition, for example, TiN layer or [Ti, Al]N layer using an arc ion plating apparatus, as a variation of physical vapor deposition apparatus schematically exemplified by FIGS. 1A and 1B. For example, the surface coating may be formed by setting the tool body in the arc ion plating apparatus; generating arc discharge by supplying a current of 90 A between anodes 61,62 and cathodes (evaporation source) 31, 32 consisting of metallic Ti or a Ti—Al alloy of a predetermined composition, where the ambient temperature is maintained at, for example, 500° C. by a heater, while a nitrogen gas is introduced as a reaction gas into the apparatus so as to achieve a reaction atmosphere with a pressure of 2 Pa, and a bias voltage of −100 V, for example, is applied to the tool body (Japanese Unexamined Patent Application, First Publication No. Hei 8-119774).

There have recently been remarkable development and installation of FA (Factory Automatization) in cutting apparatus. On the other hand, there are still strong demands for labor saving, energy saving and cost reduction in cutting operations, resulting in a trend toward higher cutting speed.

The conventional surface-coated cBN-based sintered tool, performs satisfactorily in machining of steels and cast irons under ordinary cutting conditions. However, when it is used in a high speed continuous cutting operation or a high speed interrupted cutting operation of a hardened steel, such as alloy steel or hardened bearing steel which has Vickers hardness (C scale) as high as 50 or more, abnormal damage (hereinafter referred to as edge notching) is caused at the boundary portion of the cutting edge by high heat generated at a cutting edge or drastically large mechanical load imposed intermittently and impulsively at the cutting edge. As a result, it becomes difficult to keep surface finish over an extended period of time, thus the cutting tool reaches the end of tool life in a relatively short period of time.

SUMMARY OF THE INVENTION

Under the circumstances described-above, the present inventors conducted a research aiming at the development of a surface-coated cBN-based sintered tool having a hard coating layer that exhibits excellent edge notching resistance in a high speed continuous cutting operation or a high speed interrupted cutting operation (hereinafter referred merely to a "high speed cutting operation") of a hardened steel, such as alloy steel or hardened bearing steel, and arrived at the following findings (a) through (c).

(a) The Ti—Al composite nitride $[Ti_{1-X}Al_X]N$ layer that constitutes the hard coating layer has predetermined heat resistance, high-temperature hardness and high-temperature strength, and therefore is provided with sufficient wear resistance required in common cutting conditions, where the proportion X of Al content (atomic %) is in a range from 0.40 to 0.60. However, in a high speed cutting operation of a hardened steel, which generates high heat at the cutting edge or imposes drastically large mechanical load intermittently and impulsively on the cutting edge, because of insufficient high-temperature strength of the hard coating layer consisting of the Ti—Al composite nitride $[Ti_{1-X}Al_X]N$, edge notching is caused at the boundary portion of the cutting tool. As a result, it is difficult to maintain surface finish of workpieces, and the cutting tool having reaches the end of tool life in a relatively short period of time.

(b) While the Ti nitride (TiN) layer has excellent high high-temperature strength and shock-resistant strength, but is not provided with sufficient heat resistance and high-temperature hardness. Therefore, in a high speed cutting operation of a hardened steel, which generates high heat and imposes drastically large mechanical load, a hard coating layer consisting only of the Ti nitride (TiN) layer cannot have sufficient wear resistance.

(c) When the $[Ti_{1-X}Al_X]N$ (where X is in a range from 0.40 to 0.60 in an atomic ratio) layer (hereinafter referred to as a thin layer A) of the above described (a) having the proportion X of Al content in a range from 40 to 60 atomic % and having heat resistance, high-temperature hardness and high-temperature strength is defined as thin layer A, a Ti nitride (TiN) layer which is inferior in heat resistance and high-temperature hardness as compared with the thin layer A but is excellent in high-temperature strength and shock-resistant strength is defined as thin layer B, and the thin layers A and B are layered alternately so as to constitute an upper layer of a hard coating layer such that each of thin layers has a average layer thickness of 0.05 to 0.3 µm, the hard coating layer having the alternately layered structure has excellent heat resistance and high-temperature hardness of the thin film A and also has more excellent high-temperature strength and shock-resistant strength of the thin layer B, and thus the occurrence of edge notching can be prevented.

The findings (a) through (c) were obtained through the inventors' research.

The present invention has been made on the basis of the findings described above, and provides a cutting tool made of surface-coated cubic boron nitride-based ultrahigh pressure sintered material, comprising a main body of cutting insert and a hard coating layer vapor-deposited on the surface of the main body.

The main body of cutting insert consists of ultrahigh pressure sintered material formed by ultrahigh pressure sintering of a compact having a composition of 13 to 30% of titanium nitride, 6.5 to 18% of aluminum and/or aluminum oxide and the balance of boron nitride by mass. Under an observation using a scanning electron microscope, the main body shows a texture such that a reaction product formed by the ultrahigh pressure sintering process is present at the interface between a cubic boron nitride phase constituting a disperse phase and a titanium nitride phase constituting a continuous phase. The hard coating layer deposited on the main body has constitution of following (a) to (c).

(a) The hard coating layer comprises a lower layer having a average layer thickness in a range from 1.5 to 3 μm and a upper layer having an average layer thickness in a range from 0.3 to 3 μm.

(b) The lower layer of the hard coating layer consists of a vapor-deposited composite nitride of Ti and Al having the composition of $[Ti_{1-X}Al_X]N$, where X is in a range from 0.40 to 0.60.

(c) The upper layer of the hard coating layer is vapor deposited on the lower layer and has a structure consisting of at least one thin layer A and at least one thin layer B layered alternately, where the thin layer A is a composite nitride layer of Ti and Al having the composition of $[Ti_{1-X}Al_X]N$, where X is in a range from 0.40 to 0.60 in an atomic ratio, and the thin layer B is a Ti nitride (TiN) layer. In that layered structure, each of thin layers has an average layer thickness of 0.05 to 0.3 μm.

Even in a high speed cutting operation of a hardened steel, the cutting tool made of surface-coated cubic boron nitride-based ultrahigh pressure sintered material (hereafter referred to as coated cBN-based sintered tool) of the above-described constitution can ensure excellent surface finish over an extended period of time.

Next, the reasons for setting the numerical specifications of the composition of the cBN-based sintered material of the cutting insert body constituting the surface-coated cBN-based sintered tool of the present invention, and the composition and thickness of the hard coating layer are explained in the following.

(A) Composition of cBN-Based Sintered Material of Cutting Insert Body TiN

A TiN component in a sintered material has an effect of improving sinterability and forming a continuous phase in a sintered body thereby improving the strength. When the proportion of the TiN component content is less than 13% by mass, desired strength cannot be ensured. On the other hand, when the proportion of the TiN component content is more than 30% by mass, the content of cBN relatively decreases and face wear is more likely to occur. Accordingly, the proportion of the TiN component content was set in a range from 13 to 30% by mass.

Aluminum and/or Aluminum Oxide

These components are preferentially aggregated on the surface of a cBN powder during sintering and are reacted to form a reaction product, and thus these components are present between a TiN phase constituting a continuous phase and a cBN phase constituting a hard disperse phase in a cBN-based material after sintering. Since the reaction product has properties of firmly adhered close to both of the TiN phase constituting the continuous phase and the cBN phase constituting the hard disperse phase, adhesion of the cBN phase to the TiN phase as the continuous binder phase is remarkably improved, thus resulting in improved chipping resistance of the cutting edge. When the proportions of aluminum and/or aluminum oxide contents deviate from the range of 6.5 to 18% by mass, it is impossible to serve as an intermediate adhesive layer and to ensure firm adhesion between the hard disperse phase and the continuous phase. Accordingly, the proportions of the aluminum and/or aluminum oxide contents were set in a range from 6.5 to 18% by mass.

Cubic Boron Nitride (cBN)

Cubic boron nitride (cBN) in a tool body made of an ultrahigh-pressure sintered material is very hard and forms a disperse phase in the sintered material, and wear resistance is improved by the disperse phase. When the proportion of the cubic boron nitride content is too small, desired excellent wear resistance cannot be ensured. On the other hand, when the proportion of the cubic boron nitride content is too is too large, sinterability of the cubic boron nitride (cBN)-based material itself deteriorates, thus making it easier for chipping of the cutting edge to occur. The proportion of the cubic boron nitride (cBN) content is the balance of TiN, aluminum and aluminum oxide as constituent components of the sintered material, namely, about 52 to 80% by mass.

(B) Lower Layer of Hard Coating Layer

Since a Ti component in a Ti—Al composite nitride ($[Ti_{1-X}Al_X]N$) layer constituting a lower layer of a hard coating layer contributes to retention of the high-temperature strength and an Al component contributes to improvement of high-temperature hardness and heat resistance, the Ti—Al composite nitride ($[Ti_{1-X}Al_X]N$) layer constituting the lower layer of the hard coating layer is a layer having predetermined high-temperature strength, high-temperature hardness and heat resistance and basically plays a role of ensuring wear resistance of the cutting edge in a high speed cutting operation of a hardened steel. When the proportion X of the Al content is more than 60 atomic %, high-temperature hardness and heat resistance of the lower layer are improved. However, the high-temperature strength decreases by relative decrease in the proportion of the Ti content, thus making it easier for chipping to occur. On the other hand, when the proportion X of the Al content is less than 40 atomic %, high-temperature hardness and heat resistance deteriorate, thus resulting in poor wear resistance. Accordingly, the proportion X of the Al content was set in a range from 0.40 to 0.60.

When a average layer thickness of the lower layer is less than 1.5 μm, it is impossible to impart heat resistance, high-temperature hardness and high-temperature strength of the lower layer to the hard coating layer over an extended period of time, thus resulting in a short tool life. On the other hand, when the average layer thickness is more than 3 μm, chipping is more likely to occur. Accordingly, the average layer thickness of the lower layer was set in a range from 1.5 to 3 μm.

In order to ensure sufficient adhesion between a cutting tool body made of an ultrahigh-pressure sintered material and a lower layer, a thin layer made of titanium nitride (TiN) can be interposed between the tool body and the lower layer. When the layer thickness of the thin layer made of TiN is less than 0.01 μm, less effect of improving adhesion is exerted. On the other hand, when the layer thickness is more than 0.5 μm, further improvement in adhesion can not be expected.

Accordingly, the layer thickness of the TiN layer to be interposed between the substrate and the lower layer is preferably set to 0.01 μm or more and 0.5 μm or less.

(C) Upper Layer of Hard Coating Layer

1) Thin Layer A of Upper Layer

A Ti—Al composite nitride ($[Ti_{1-X}Al_X]N$) layer (where X is in a range from 0.40 to 0.60 in an atomic ratio) constituting a thin layer A of a upper layer is substantially similar to the lower layer, and has predetermined heat resistance, high-temperature hardness and high-temperature strength and also has the effect of ensuring wear resistance at the cutting edge in a high speed cutting operation of a hardened steel.

2) Thin Layer B of Upper Layer

A main object of a thin layer B made of Ti nitride (TiN) is to make up for insufficient characteristics (high-temperature strength, shock-resistant strength) of the thin layer A in the upper layer having an alternately layered structure comprising the thin layer A and the thin layer B.

As described hereinabove, the thin layer A of the upper layer is a layer having predetermined heat resistance, high-temperature hardness and high-temperature strength, but does not exhibit sufficient high-temperature strength and shock-resistant strength in a high speed cutting operation of a hardened steel which imposes large mechanical load and generates high heat. Consequently, edge notching occurs at the boundary portion of a lip of the cutting edge.

By alternately stacking the thin layer B made of Ti nitride (TiN) having excellent high-temperature strength and shock-resistant strength, and the thin layer A to form an alternately layered structure, insufficient high-temperature strength and shock-resistant strength of adjacent thin layer A are improved, and a upper layer having more excellent high-temperature strength and shock-resistant strength as compared with the thin layer B is formed without impairing excellent heat resistance, high-temperature hardness and high-temperature strength of the thin layer A.

The Ti nitride (TiN) layer has excellent high-temperature strength and shock-resistant strength and has the effect of preventing the occurrence of edge notching at the boundary portion of a lip of a cutting edge in a high speed cutting operation of a hardened steel which imposes large mechanical load and generates high heat.

3) Average Layer Thickness of Single Thin Layer A and Single Thin Layer B of Upper Layer, and Average Layer Thickness of Upper Layer When average layer thickness of each single layer of the thin layers A and the thin layers B of the upper layer is less than 0.05 μm, excellent characteristics of each thin layer can not be exhibited and thus it becomes impossible to impart excellent high-temperature hardness, high-temperature strength and heat resistance as well as more excellent high-temperature strength and shock-resistant strength to the upper layer. On the other hand, when the average layer thickness of each single layer is more than 0.3 μm, defective properties of each thin layer, namely insufficient high-temperature strength and shock-resistant strength of the thin layer A or insufficient heat resistance and high-temperature hardness of the thin layer B, appear locally in the upper layer, thus making it easier for edge notching of a lip of a cutting edge to occur or accelerating the progress of wear. Accordingly, average layer thickness of each single thin layer was set in the range from 0.05 to 0.3 μm.

The thin layer B was provided so as to impart more excellent high-temperature strength and shock-resistant strength to the upper layer. When average layer thickness of each single thin layer of the thin layer A and the thin layer B is in a range from 0.05 to 0.3 μm, the upper layer having an alternately layered structure comprising the thin layer A and the thin layer B serves like one layer having excellent heat resistance and high-temperature hardness as well as more excellent high-temperature strength and shock-resistant strength. When average layer thickness of each single thin layer of the thin layer A and the thin layer B is more than 0.3 μm, insufficient high-temperature strength and shock-resistant strength of the thin layer A or insufficient heat resistance and high-temperature hardness of the thin layer B, appear locally in the upper layer, and thus the upper layer cannot exhibit good characteristics as one layer. Accordingly, average layer thickness of each single thin layer of the thin layer A and the thin layer B was set in the range from 0.05 to 0.3 μm.

By forming a upper layer having an alternately layered structure in which average layer thickness of each single thin layer of the thin layer A and the thin layer B was set in the range from 0.05 to 0.3 μm, on the surface of the lower layer, a hard coating layer having excellent heat resistance and high-temperature hardness as well as more excellent high-temperature strength and shock-resistant strength is obtained, thus making it possible to prevent the occurrence of edge notching at the boundary portion of a lip of a cutting edge in a high speed continuous cutting operation or a high speed interrupted cutting operation of a hardened steel such as hardened steel.

When the total average layer thickness (namely, the total layer thickness as a sum of respective average layer thicknesses of the thin layer A and the thin layer B that constitute an alternately layered structure) of the upper layer is less than 0.3 μm, sufficient heat resistance, high-temperature hardness, high-temperature strength and shock-resistant strength required in a high speed cutting operation of a hardened steel such as hardened steel cannot be imparted to the upper layer, thus resulting in a shorter tool life. On the other hand, when the layer thickness is more than 3 μm, chipping is more likely to occur. Accordingly, the average layer thickness was set in a range from 0.3 to 3 μm.

In the surface-coated cBN-based sintered tool of the present invention, an interference color developed delicately varies depending on the layer thickness of the coating layer on the outermost surface, thus resulting in uneven appearance of the tool. In such a case, uneven appearance of the tool can be prevented by forming a thick Ti—Al composite nitride (TiAlN) layer using a vapor deposition method. In that case, when the average layer thickness of the TiAlN layer is less than 0.2 μm, uneven appearance cannot be prevented. When the average layer thickness is not more than 2 μm, uneven appearance can be sufficiently provided. Accordingly, the average layer thickness of the Ti—Al composite nitride (TiAlN) layer is preferably set in a range from 0.2 to 2 μm.

Surface roughness Ra of the surface-coated cBN-based sintered tool body of the present invention is preferably 0.05 or more and 1.0 or less. When the surface roughness Ra is 0.05 or more, adhesion between the substrate and the hard coating layer by means of an anchor effect can be expected. On the other hand, when Ra is more than 1.0, an adverse influence is exerted on surface finish of work material.

The surface-coated cBN-based sintered tool of the present invention is provided with a hard coating layer comprising a upper layer and a lower layer. By forming the upper layer in a structure consisting of a thin layer A and a thin layer B layered alternately one on another, it is made possible to achieve excellent heat resistance, high-temperature hardness, high-temperature strength and shock-resistant strength, so that the surface-coated cBN-based sintered tool can maintain excellent wear resistance over an extended period of time and also maintain excellent surface finish of work materials without causing edge notching at the hard coating layer even in cutting operation under severe conditions, for example, high speed continuous cutting operation or high speed interrupted cutting operation of a hardened steel such as alloy steel or hardened bearing steel, which generates high heat and imposes a mechanical load intermittently and impulsively on a cutting edge.

PREFERRED EMBODIMENTS OF THE INVENTION

The surface-coated cBN-based sintered tool of the present invention will now be described in detail by way of examples.

Example

Cubic boron nitride (cBN) powder, Ti nitride (TiN) powder, Al powder and aluminum oxide ($Al_2O_3$) powder, all having a mean particle size in a range from 0.5 to 4 µm, were prepared as stock material powders, and were mixed in proportions shown in Table 1, using a ball mill in wet process for 80 hours. After drying, the mixture was pressed into a compact measuring 50 mm in diameter and 1.5 mm in thickness with a pressure of 120 MPa. The compact was sintered by heating at a temperature in a range from 900 to 1300° C. for 60 minutes in vacuum of 1 Pa to obtain a presintered body for cutting edge. Separately, a support member made of a WC-based cemented carbide measuring 50 mm in diameter and 2 mm in thickness, and having the composition of 8% by mass of Co and the balance of WC was prepared. The presintered body and the support member were set in a conventional ultrahigh pressure sintering apparatus in the state where they are laid one upon another and ultrahigh pressure-sintered under the ordinary conditions of a pressure of 5 GPa, a temperature in a range from 1200 to 1400° C. and a holding time of 0.8 hours. After sintering, the top and bottom surfaces of the resulting sintered body was polished using a diamond bonded abrasive. The sintered body was cut into an equilateral triangle-shaped tip having a side of 3 mm using a wire electric discharge machining apparatus. A insert body made of a WC-based cemented carbide having the composition of 5% by mass of Co, 5% by mass of TaC and the balance of WC, and measuring a configuration SNGA120412 specified in ISO standard (square measuring 4.76 mm in thickness and 12.7 mm in side) was prepared. The above-described cut tip of ultra-high pressure sintered body was soldered to the soldering portion (corner portion) of the above-described insert body using a soldering material of Ag alloy having the composition of 26% Cu, 5% Ti, 2.5% Ni and the balance of Ag. After a peripheral milling to from a body having a predetermined size, the cutting edge portion was subjected to honing process (width: 0.13 mm, angle: 25°), and then subjected to finish polishing. In accordance with the above described process, tool bodies A through J having a geometrical configuration of insert meeting SNGA120412 specified in ISO standard were produced.

Figure 1A:
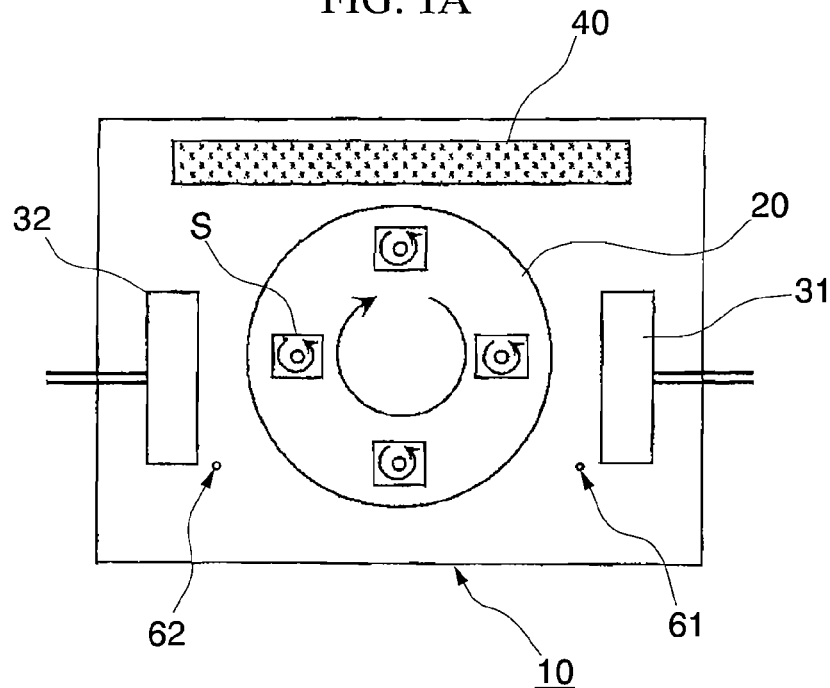
FIG. 1A is a schematic plan view of an arc ion plating apparatus used to form the hard coating layer as a constituent of the surface-coated cBN-based sintered tool of the present invention.
Figure 1B:
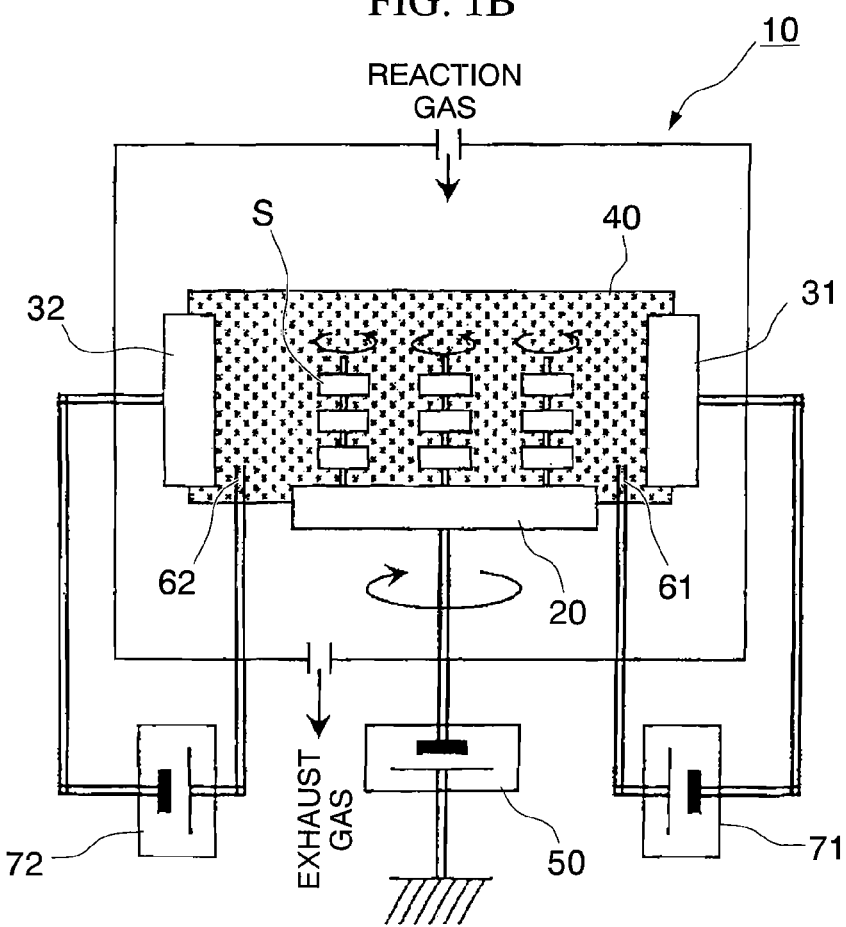
FIG. 1B is a schematic front view of the arc ion plating apparatus used to form the hard coating layer as a constituent of the surface-coated cBN-based sintered tool of the present invention.

(a) Then the tool bodies A through J were subjected to ultrasonic cleaning in acetone. After drying, the tool bodies were set on a rotary table 20 along the circumference thereof at a predetermined radial distance from the center, in an arc ion plating apparatus 10 as shown in FIGS. 1A and 1B. A metallic Ti for forming the thin layer B as the upper layer was placed as a cathode (evaporation source) 31 on one side, and as a cathode (evaporation source) 32 for forming the thin layer A as the upper layer and the lower layer, a Ti—Al alloy having the composition corresponding to the target composition shown in Table 2 was placed on the other side opposing each other with the rotary table 2 located therebetween. The reference symbol 50 denotes a bias power source and the reference symbol 71,72 denote arc power sources.

(b) While evacuating the apparatus to maintain the inside at a level of vacuum not higher than 0.1 Pa, the inside of the apparatus was heated to 500° C. using a heater 40 and an Ar gas was introduced into the apparatus to maintain a reaction atmosphere of 0.7 Pa and also a DC bias voltage of 200 V was applied to the tool body S that was spinning on the rotating table 20, thereby cleaning the surface of the tool body S by bombardment of argon ions.

(c) Then a nitrogen gas was introduced as a reaction gas into the apparatus to maintain a reaction atmosphere of 3 Pa, and a DC bias voltage of −100 V was applied to the tool body S that was spinning on the rotating table 20. At the same time, arc discharge was generated by supplying a current of 100 A between the Ti—Al alloy used for forming the thin layer A and the lower layer, and the anode 62 thereby vapor depositing the [Ti, Al]N layer having the target composition and the target layer thickness shown in Table 2 was vapor deposited as the lower layer of the hard coating layer on the surface of the tool body S.

(d) Then a flow rate of a nitrogen gas as a reaction gas to be introduced into the apparatus was controlled to maintain a reaction atmosphere of 2 Pa, and a DC bias voltage in a range from −10 to −100 V was applied to the tool body S that was spinning on the rotating table 20. At the same time, arc discharge was generated by supplying a current of predetermined intensity in a range from 50 to 200 A between the cathode 31 of the metallic Ti used for forming the thin layer B, and the anode 61, thereby forming the thin layer B of a predetermined thickness on the surface of the tool body. After forming the thin layer B, the arc discharge was stopped and a current of predetermined intensity in a range from 50 to 200 A was supplied between the cathode 32 of Ti—Al alloy used for forming the thin layer A and the lower layer and the anode 62, thereby generating arc discharge and forming the thin layer A of the predetermined thickness. Then the arc discharge was stopped. Then again the formation of the thin layer B by means of arc discharge between the cathode 31 of the metallic Ti used for forming the thin layer B and the anode 61, and the formation of the thin layer A by means of arc discharge between the cathode 32 of a Ti—Al alloy used for forming the thin layer A and the lower later and the anode 62 were repeated alternately. Thus the upper layer having the structure consisting of the thin layer A and the thin layer B layered alternately having the target composition and the target thickness for single layer shown in Table 2 was formed on the surface of the tool body with the total thickness (average layer thickness) shown in Table 2 by vapor deposition. Thus each of the surface-coated cBN-based sintered tools according to the invention was produced.

Figure 2:
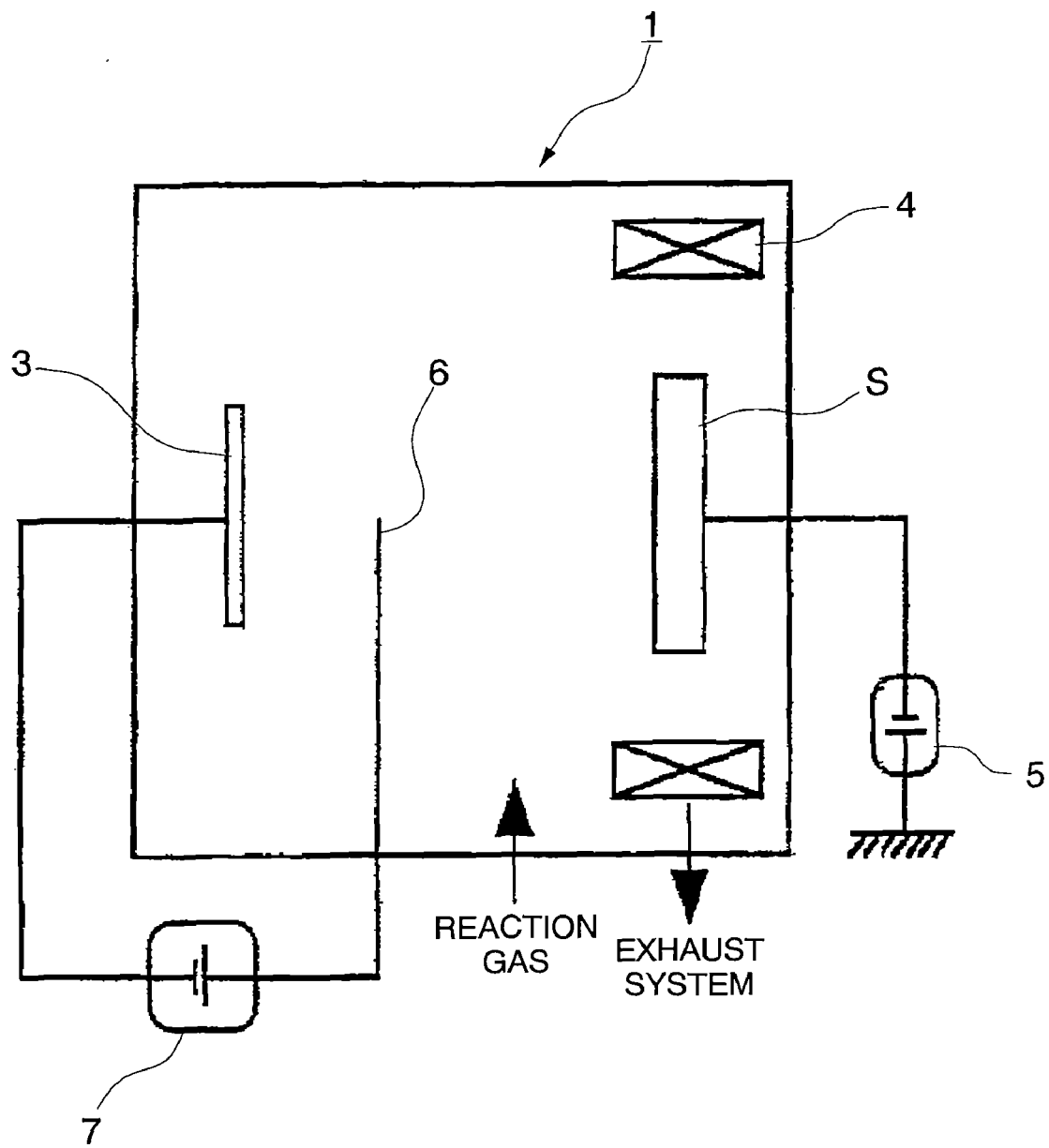
FIG. 2 is a schematic diagram showing a conventional arc ion plating apparatus.

For the purpose of comparison, the tool bodies A through J were subjected to ultrasonic cleaning in acetone. After drying, the tool bodies were set in an ordinary arc ion plating apparatus 1 as shown in FIG. 2, and the Ti—Al alloy having the composition corresponding to the target composition shown in Tables 3 was disposed as a cathode (evaporation source) 3. While evacuating the apparatus to maintain the inside at a level of vacuum not higher than 0.1 Pa, the inside of the apparatus was heated to 500° C. using a heater 4 and an Ar gas was introduced into the apparatus to maintain a reaction atmosphere of 0.7 Pa and also a DC bias voltage of −200 V was applied from a bias voltage source 5 to the tool body S that was spinning on the rotating table 2, thereby cleaning the surface of the tool body by bombardment of argon ions. Then a nitrogen gas was introduced as a reaction gas into the apparatus to maintain a reaction atmosphere of 3 Pa, and the bias voltage applied to the tool body was −100 V, and arc discharge was generated between the cathode 3 made of the Ti—Al alloy and the anode 6 using an arc power source 7. Thus the surfaces of the tool bodies A through J were coated with the [Ti, Al]N layer having the target composition and target layer thickness shown in Tables 3, thereby producing conventional surface-coated cBN-based sintered tools 1 to 10.

With respect to the cBN-based sintered material constituting the cutting insert body of various surface-coated cBN-based sintered tools thus obtained, the structure was observed using a scanning electron microscope. As a result, all cutting insert bodies exhibited the structure in which an ultrahigh pressure sintering reaction product is present at the interface between a cBN phase constituting substantially a disperse phase and a TiN phase constituting a continuous phase.

Furthermore, the compositions of the surface coating layer was analyzed by energy-dispersive X-ray spectrometry using a transmission electron microscope, and all samples showed substantially the same compositions as the target compositions. Also the average layer thickness of the constituent layers of the hard coating layer was measured by observing the cross section with a transmission electron microscope. All samples showed substantially the same average layer thickness as the target thickness (mean of measurements at 5 points).

Then various surface-coated cBN-based sintered tools were mounted at the distal end of a cutting tool made of tool steel by screwing a clamp fixture. The surface-coated cBN-based sintered tools Nos. 1 through 5 according to the invention and the conventional surface-coated cBN-based sintered tools Nos. 1 through 5 were subjected to high speed interrupted cutting operation test under the following cutting conditions A through C. Also the surface-coated cBN-based sintered tools Nos. 6 through 10 according to the invention and the conventional surface-coated cBN-based sintered tools Nos. 6 through 10 were subjected to high speed continuous cutting operation test under the following cutting conditions a through c.

[Cutting Conditions A]

Interrupted high speed cutting operation test (normal cutting speed was 120 m/min.) in dry process of an alloy steel was performed under the following conditions:
Workpiece: Carburized and hardened round bar of JIS SCM415 (hardness HRC61) with 4 grooves formed in longitudinal direction at equal spaces
Cutting speed: 200 m/min.
Depth of cut: 0.2 mm
Feed: 0.15 mm/rev.
Cutting time: 6 minutes

[Cutting Conditions B]

Interrupted high speed cutting operation test (normal cutting speed was 120 m/min.) in dry process of a chrome steel was performed under the following conditions:
Workpiece: Carburized and hardened round bar of JIS SCr420 (hardness: HRC60) with 4 grooves formed in longitudinal direction at equal spaces
Cutting speed: 210 m/min.
Depth of cut: 0.15 mm
Feed: 0.12 mm/rev.
Cutting time: 6 minutes

[Cutting Conditions C]

Interrupted high speed cutting operation test (normal cutting speed was 150 m/min.) in dry process of a bearing steel was performed under the following conditions:
Workpiece: Hardened round bar of JIS SUJ2 (hardness: HRC61) with 4 grooves formed in longitudinal direction at equal spaces.
Cutting speed: 240 m/min.
Depth of cut: 0.16 mm
Feed: 0.10 mm/rev.
Cutting time: 6 minutes

[Cutting Conditions a]

Continuous high speed cutting operation test (normal cutting speed was 200 m/min.) in dry process of an alloy steel was performed under the following conditions:
Workpiece: Carburized and hardened round bar of JIS SCM415 (hardness: HRC61)
Cutting speed: 280 m/min.
Depth of cut: 0.2 mm
Feed: 0.10 mm/rev.
Cutting time: 8 minutes

[Cutting Conditions b]

Continuous high speed cutting operation test (normal cutting speed was 160 m/min.) in dry process of a chrome steel was performed under the following conditions:
Workpiece: Carburized and hardened round bar of JIS SCr420 (hardness: HRC60)
Cutting speed: 250 m/min.
Depth of cut: 0.2 mm
Feed: 0.1 mm/rev.
Cutting time: 8 minutes

[Cutting Conditions c]

Continuous high speed cutting operation test (normal cutting speed was 150 m/min.) in dry process of a bearing steel was performed under the following conditions:
Workpiece: Hardened round rod of JIS SUJ2 (hardness HRC61)
Cutting speed: 220 m/min.
Depth of cut: 0.2 mm
Feed: 0.1 mm/rev.
Cutting time: 8 minutes Flank wear width (mm) of the cutting tool edge and surface finish (arithmetic mean height (Ra(μm)) according to JIS B0601-2001) of workpiece were measured in every run of the cutting tests described above. The results are shown in Table 4.

TABLE 1

| Type | | TiN | Al | $Al_2O_3$ | cBN |
|---|---|---|---|---|---|
| TOOL BODY | A | 13 | 16 | 2.0 | Balance |
| | B | 15 | 17 | — | Balance |
| | C | 17 | 15 | — | Balance |
| | D | 19 | 13 | 1.0 | Balance |
| | E | 21 | 12 | 0.5 | Balance |
| | F | 22 | 10 | 1.2 | Balance |
| | G | 24 | 11 | 1.0 | Balance |
| | H | 26 | 12 | — | Balance |
| | I | 28 | 6 | 0.5 | Balance |
| | J | 30 | 8 | 0.2 | Balance |

Composition (% by mass)

TABLE 2

| | | | Hard coating layer | | | | | |
| --- | --- | --- | --- | --- | --- | --- | --- | --- |
| | | | Lower layer | | | Upper layer | | |
| | | | | | | Thin layer A | | Thin layer B | Total |
| Type | | Symbol of tool body | Target composition (atomic ratio) | | Target thickness (μm) | Target composition (atomic ratio) | | Target thickness of one layer (μm) | Target thickness of one layer (μm) | thickness of upper layer (μm) |
| | | | Ti | Al | N | | Ti | Al | N | | | |
| Inventive surface-coated cBN-based sintered tool | 1 | A | 0.60 | 0.40 | 1.00 | 1.5 | 0.60 | 0.40 | 1.00 | 0.05 | 0.05 | 3.0 |
| | 2 | B | 0.55 | 0.45 | 1.00 | 2.2 | 0.55 | 0.45 | 1.00 | 0.06 | 0.1 | 0.48 |
| | 3 | C | 0.52 | 0.48 | 1.00 | 3.0 | 0.52 | 0.48 | 1.00 | 0.05 | 0.3 | 1.75 |
| | 4 | D | 0.48 | 0.52 | 1.00 | 1.6 | 0.48 | 0.52 | 1.00 | 0.3 | 0.1 | 1.2 |
| | 5 | E | 0.45 | 0.55 | 1.00 | 2.6 | 0.45 | 0.55 | 1.00 | 0.15 | 0.2 | 1.05 |
| | 6 | F | 0.60 | 0.40 | 1.00 | 1.5 | 0.60 | 0.40 | 1.00 | 0.05 | 0.05 | 0.5 |
| | 7 | G | 0.55 | 0.45 | 1.00 | 2.2 | 0.55 | 0.45 | 1.00 | 0.06 | 0.1 | 0.48 |
| | 8 | H | 0.52 | 0.48 | 1.00 | 3.0 | 0.52 | 0.48 | 1.00 | 0.05 | 0.1 | 0.3 |
| | 9 | I | 0.48 | 0.52 | 1.00 | 1.6 | 0.48 | 0.52 | 1.00 | 0.3 | 0.1 | 1.2 |
| | 10 | J | 0.45 | 0.55 | 1.00 | 2.6 | 0.45 | 0.55 | 1.00 | 0.15 | 0.2 | 1.05 |

TABLE 3

| | | | Hard coating layer | | | |
| --- | --- | --- | --- | --- | --- | --- |
| | | | Target composition (atomic ratio) | | | Target thickness |
| Type | | Symbol of tool body | Ti | Al | N | (μm) |
| Conventional surface-coated cBN-based sintered too | 1 | A | 0.60 | 0.40 | 1.00 | 2.0 |
| | 2 | B | 0.55 | 0.45 | 1.00 | 2.6 |
| | 3 | C | 0.52 | 0.48 | 1.00 | 3.3 |
| | 4 | D | 0.48 | 0.52 | 1.00 | 2.8 |
| | 5 | E | 0.45 | 0.55 | 1.00 | 6.0 |
| | 6 | F | 0.60 | 0.40 | 1.00 | 2.0 |
| | 7 | G | 0.55 | 0.45 | 1.00 | 2.6 |
| | 8 | H | 0.52 | 0.48 | 1.00 | 3.3 |
| | 9 | I | 0.48 | 0.52 | 1.00 | 2.8 |
| | 10 | J | 0.45 | 0.55 | 1.00 | 3.8 |

TABLE 4

| | | Cutting conditions (A) | | Cutting conditions (B) | | Cutting conditions (C) | |
| --- | --- | --- | --- | --- | --- | --- | --- |
| Type | | Width of flank wear (mm) | Surface finish [Ra (μm)] | Width of flank wear (mm) | Surface finish [Ra (μm)] | Width of flank wear (mm) | Surface finish [Ra (μm)] |
| Inventive surface-coated cBN-based sintered tool | 1 | 0.11 | 1.2 | 0.11 | 0.9 | 0.09 | 0.8 |
| | 2 | 0.10 | 1.0 | 0.12 | 0.8 | 0.08 | 0.8 |
| | 3 | 0.09 | 1.1 | 0.11 | 0.8 | 0.12 | 0.9 |
| | 4 | 1.09 | 1.0 | 0.09 | 0.7 | 0.12 | 1.0 |
| | 5 | 1.12 | 1.3 | 0.10 | 0.9 | 0.10 | 0.9 |

| | | Cutting conditions (a) | | Cutting conditions (b) | | Cutting conditions (c) | |
| --- | --- | --- | --- | --- | --- | --- | --- |
| Type | | Width of flank wear (mm) | Surface finish [Ra (μm)] | Width of flank wear (mm) | Surface finish [Ra (μm)] | Width of flank wear (mm) | Surface finish [Ra (μm)] |
| Inventive surface-coated cBN-based sintered tool | 6 | 0.11 | 0.5 | 0.11 | 0.6 | 0.12 | 0.6 |
| | 7 | 0.12 | 0.6 | 0.08 | 0.5 | 0.10 | 0.6 |
| | 8 | 0.09 | 0.6 | 0.07 | 0.6 | 0.08 | 0.8 |
| | 9 | 0.12 | 0.6 | 0.10 | 0.7 | 0.10 | 0.6 |
| | 10 | 0.10 | 0.5 | 0.11 | 0.6 | 0.12 | 0.5 |

| | | Cutting conditions (A) | | Cutting conditions (B) | | Cutting conditions (C) | |
| --- | --- | --- | --- | --- | --- | --- | --- |
| Type | | Width of flank wear (mm) | Surface finish [Ra (μm)] | Width of flank wear (mm) | Surface finish [Ra (μm)] | Width of flank wear (mm) | Surface finish [Ra (μm)] |
| Conventional surface-coated cBN-based sintered tool | 1 | 1 min.** | — | 1 min.** | — | 0.5 min.** | — |
| | 2 | 2 min.** | — | 2 min.** | — | 1 min.** | — |
| | 3 | 1.5 min.** | — | 1 min.** | — | 0.5 min.** | — |
| | 4 | 1 min.** | — | 0.5 min.** | — | 1.5 min.** | — |
| | 5 | 0.5 min.** | — | 1 min.** | — | 1 min.** | — |

TABLE 4-continued

| Type | | Cutting conditions (a) | | Cutting conditions (b) | | Cutting conditions (c) | |
|---|---|---|---|---|---|---|---|
| | | Width of flank wear (mm) | Surface finish [Ra (μm)] | Width of flank wear (mm) | Surface finish [Ra (μm)] | Width of flank wear (mm) | Surface finish [Ra (μm)] |
| Conventional surface-coated cBN-based sintered tool | 6 | 0.10* | 1.5 | 0.12* | 1.8 | 0.12* | 1.6 |
| | 7 | 0.10* | 2.0 | 5 min.** | — | 5 min.** | — |
| | 8 | 0.12* | 1.7 | 0.10* | 2.0 | 0.12* | 2.5 |
| | 9 | 4 min.** | — | 3 min.** | — | 0.10* | 1.8 |
| | 10 | 5 min.** | — | 5 min.** | — | 6 min.** | — |

In the table, the symbol* means tools in which edge notching occurred, while the symbol** means the cutting time (min.) of tools in which tool life ended due to edge notching and chipping.

The results shown in Tables 2 through 4 obviously show the following effects of the invention. All the surface-coated cBN-based sintered tools according to the present invention had the hard coating layer comprising: the lower layer having the average layer thickness in a range from 1.5 to 3 μm; and the upper layer of the average layer thickness (total thickness) in a range from 0.3 to 3 μm, consisting of the thin layer A and the thin layer B each having the average layer thickness in a range from 0.05 to 0.3 μm layered alternately one on another. In each of the surface-coated cBN-based sintered tools of the invention, since the lower layer is provided with excellent heat resistance, high-temperature strength and high-temperature hardness, and the upper layer is provided with excellent heat resistance and high-temperature hardness as well as more excellent high-temperature strength and shock-resistant strength, the hard coating layer combined these excellent characteristics, and therefore can exhibit excellent wear resistance and ensure excellent surface finish of workpieces without causing edge notching and chipping even in a high speed cutting operation of a hardened steel, for example, hardened steel such as alloy steel or bearing steel. In contrast, the conventional surface-coated cBN-based sintered tools having the hard coating layer comprising [Ti, Al]N layer of the single phase structure, caused edge notching or chipping at the cutting edge because of insufficient high-temperature strength and shock-resistant strength of the hard coating layer, and also cannot maintain surface finish of workpieces and it is apparent that tool life will end in a relatively short period of time.

As described above, as well as in a machining of various steels and cast irons under ordinary cutting conditions, even in a high speed continuous cutting operation or a high speed interrupted cutting operation of a hardened steel accompanied with generation of high heat and imposition of drastically large mechanical load intermittently and impulsively on a cutting edge, the surface-coated cBN-based sintered tool of the present invention is excellent in edge notching resistance exhibited by the hard coating layer, maintains excellent surface finish of work material over an extended period of time and exhibits excellent wear resistance. Thus the surface-coated cBN-based sintered tool of the present invention can sufficiently allows for labor saving, energy saving and cost reduction in metal cutting operations and contributes to the enhancement of performance of cutting apparatus.

While preferred embodiments of the invention have been described and illustrated above, it should be understood that these are exemplary of the invention and are not to be considered limiting. Additions, omissions, substitutions and other modifications can be made without departing from the spirit or scope of the present invention. Accordingly, the invention is not considered as being limited by the foregoing description, and is only limited by the scope of the appended claims.

What is claimed is:

1. A cutting tool made of surface-coated cubic boron nitride-based ultrahigh pressure sintered material, comprising:

a main body consisting of ultrahigh pressure sintered material formed by ultrahigh pressure sintering of a compact having a composition of, in mass %, 13 to 30% of titanium nitride, 6.5 to 18% of aluminum and/or aluminum oxide and a balance of boron nitride, under an observation using a scanning electron microscope, the main body showing a texture such that an ultrahigh pressure sintering reaction product is present at the interface between a cubic boron nitride phase constituting a disperse phase and a titanium nitride phase constituting a continuous phase; and a hard coating that is vapor-deposited on the surface of the main body and has a lower layer of an average layer thickness in a range from 1.5 to 3 μm and an upper layer of an average layer thickness in a range from 0.3 to 3 μm, wherein:

surface roughness Ra of the main body is 0.05 or more and 1.0 or less;

the lower layer of the hard coating layer consists of a vapor-deposited composite nitride of Ti and Al having the composition of $[Ti_{1-X}Al_X]N$, where X is in a range from 0.40 to 0.60 in an atomic ratio; and the upper layer of the hard coating layer is vapor-deposited on the surface of the lower layer, having thin layers A consisting of a composite nitride of Ti and Al having the composition of $[Ti_{1-X}Al_X]N$, where X is in a range from 0.40 to 0.60 in an atomic ratio, and thin layers B consisting of a Ti nitride (TiN), and has a structure in which the thin layers A and the thin layers B are layered alternately such that an average layer thickness of each single thin layer A is in a range of 0.05 to 0.3 μm, an average layer thickness of each single thin layer B is in a range of 0.05 to 0.3 μm, wherein the hard coating further comprises a titanium nitride layer of 0.01 to 0.5 μm in thickness interposed between the main body and the lower layer.

2. A surface-coated cutting tool according to claim 1, wherein the hard coating further comprises a Ti—Al composite nitride layer of 0.2 to 2 μm in thickness formed on the surface of the upper layer.

3. A surface-coated cutting tool according to claim 1, wherein the upper layer of the hard coating layer consists of at least two thin layers A and at least two thin layers B stacked alternately.

4. A surface-coated cutting tool according to claim 1, wherein the upper layer of the hard coating layer consists of at least three thin layers A and at least three thin layers B stacked alternately.

5. A surface-coated cutting tool according to claim 1, wherein the upper layer of the hard coating layer consists of two to three thin layers A and two to three thin layers B stacked alternately.

6. A surface-coated cutting tool according to claim 1, wherein the upper layer of the hard coating layer has an average layer thickness of each single thin layer A in a range of 0.06 to 0.3 μm.

* * * * *